(12) United States Patent
King

(10) Patent No.: US 6,912,151 B2
(45) Date of Patent: Jun. 28, 2005

(54) NEGATIVE DIFFERENTIAL RESISTANCE (NDR) BASED MEMORY DEVICE WITH REDUCED BODY EFFECTS

(75) Inventor: Tsu-Jae King, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 10/185,559

(22) Filed: Jun. 28, 2002

(65) Prior Publication Data

US 2004/0032770 A1 Feb. 19, 2004

(51) Int. Cl.[7] .............................................. G11C 11/00
(52) U.S. Cl. ...................... 365/158; 365/159; 365/187; 365/189.11
(58) Field of Search .............................. 365/158, 159, 365/189.11, 187

(56) References Cited

U.S. PATENT DOCUMENTS

| | | |
|---|---|---|
| 3,588,736 A | 6/1971 | McGroddy |
| 3,903,542 A | 9/1975 | Nathanson et al. |
| 3,974,486 A | 8/1976 | Curtis et al. |
| 4,047,974 A | 9/1977 | Harari |
| 4,143,393 A | 3/1979 | DiMaria et al. |
| 4,644,386 A | 2/1987 | Nishizawa et al. |
| 4,806,998 A | 2/1989 | Vinter et al. |
| 4,945,393 A | 7/1990 | Beltram et al. |
| 5,021,841 A | 6/1991 | Leburton et al. |
| 5,023,836 A | 6/1991 | Mori |
| 5,032,891 A | 7/1991 | Takagi et al. |
| 5,084,743 A | 1/1992 | Mishra et al. |
| 5,093,699 A | 3/1992 | Weichold et al. |
| 5,130,763 A | 7/1992 | Delhaye et al. |
| 5,162,880 A | 11/1992 | Hazama et al. |
| 5,189,499 A | 2/1993 | Izumi et al. |
| 5,357,134 A | 10/1994 | Shimoji |

(Continued)

FOREIGN PATENT DOCUMENTS

| | | |
|---|---|---|
| EP | 0747940 A2 | 12/1996 |
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1169456 A2 | 1/2002 |
| EP | 1204146 A1 | 5/2002 |
| JP | 8018033 A2 | 1/1996 |
| JP | 2001 01015757 A2 | 1/2001 |
| WO | WO 90/03646 A1 | 4/1990 |
| WO | WO 99/63598 A1 | 4/1999 |
| WO | WO 00/41309 A1 | 7/2000 |
| WO | WO 01/65597 A1 | 9/2001 |
| WO | WO 01/69607 A2 | 9/2001 |
| WO | WO 01/88977 A2 | 11/2001 |
| WO | WO 01/99153 A2 | 12/2001 |

OTHER PUBLICATIONS

Barlow, P. S. et al., "Negative differential output conductance of self–heated power MOSFETs," IEE Proceedings–I Solid–State and Electron Devices, vol. 133, Part I, No. 5, Oct. 1986, pp. 177–179.

(Continued)

*Primary Examiner*—Son T. Dinh
*Assistant Examiner*—Tuan T. Nguyen
(74) *Attorney, Agent, or Firm*—Bever, Hoffman & Harms, LLP; Jeanette S. Harms

(57) ABSTRACT

A memory device (such as an SRAM) using negative differential resistance (NDR) elements is disclosed. Body effect performances for NDR FETs (and other FETs) that may be used in such device are enhanced by floating a body of some/all the NDR FETs. Various embodiments using common or separate wells for such elements are illustrated to achieve superior body effect performance results, including a silicon-on-insulator (SOI) implementation.

28 Claims, 5 Drawing Sheets

U.S. PATENT DOCUMENTS

| | | | |
|---|---|---|---|
| 5,390,145 A | 2/1995 | Nakasha et al. | |
| 5,442,194 A | 8/1995 | Moise | |
| 5,448,513 A | 9/1995 | Hu et al. | |
| 5,455,432 A | 10/1995 | Hartsell et al. | |
| 5,463,234 A | 10/1995 | Toriumi et al. | |
| 5,477,169 A | 12/1995 | Shen et al. | |
| 5,523,603 A | 6/1996 | Fishbein et al. | |
| 5,543,652 A | 8/1996 | Ikeda et al. | |
| 5,552,622 A | 9/1996 | Kimura | |
| 5,606,177 A | 2/1997 | Wallace et al. | |
| 5,633,178 A | 5/1997 | Kalnitsky | |
| 5,689,458 A | 11/1997 | Kuriyama | |
| 5,698,997 A | 12/1997 | Williamson, III et al. | |
| 5,705,827 A | 1/1998 | Baba et al. | |
| 5,732,014 A | 3/1998 | Forbes | |
| 5,761,114 A | 6/1998 | Bertin et al. | |
| 5,770,958 A | 6/1998 | Arai et al. | |
| 5,773,996 A | 6/1998 | Takao | |
| 5,798,965 A | 8/1998 | Jun | |
| 5,804,475 A | 9/1998 | Meyer et al. | |
| 5,843,812 A | 12/1998 | Hwang | |
| 5,869,845 A | 2/1999 | Van der Wagt et al. | |
| 5,883,549 A | 3/1999 | De Los Santos | |
| 5,883,829 A | 3/1999 | Van der Wagt | |
| 5,895,934 A | 4/1999 | Harvey et al. | |
| 5,903,170 A | 5/1999 | Kulkarni et al. | |
| 5,907,159 A | 5/1999 | Roh et al. | |
| 5,936,265 A | 8/1999 | Koga | |
| 5,945,706 A | 8/1999 | Jun | |
| 5,953,249 A | 9/1999 | Van der Wagt | |
| 5,959,328 A | 9/1999 | Krautschneider et al. | |
| 5,962,864 A | 10/1999 | Leadbeater et al. | |
| 6,015,739 A | 1/2000 | Gardner et al. | |
| 6,015,978 A | 1/2000 | Yuki et al. | |
| 6,075,265 A | 6/2000 | Goebel et al. | |
| 6,077,760 A | 6/2000 | Fang et al. | |
| 6,084,796 A | 7/2000 | Kozicki et al. | |
| 6,091,077 A | 7/2000 | Morita et al. | |
| 6,097,036 A | 8/2000 | Teshima et al. | |
| 6,104,631 A | 8/2000 | El-Sharawy et al. | |
| 6,128,216 A | 10/2000 | Noble, Jr. et al. | |
| 6,130,559 A | 10/2000 | Balsara et al. | |
| 6,150,242 A | 11/2000 | Van der Wagt et al. | |
| 6,184,539 B1 | 2/2001 | Wu et al. | |
| 6,205,054 B1 | 3/2001 | Inami | |
| 6,222,766 B1 | 4/2001 | Sasaki et al. | |
| 6,225,165 B1 | 5/2001 | Noble, Jr. et al. | |
| 6,246,606 B1 | 6/2001 | Forbes et al. | |
| 6,261,896 B1 | 7/2001 | Jun | |
| 6,294,412 B1 | 9/2001 | Krivokapic | |
| 6,301,147 B1 | 10/2001 | El-Sharawy et al. | |
| 6,303,942 B1 | 10/2001 | Farmer | |
| 6,310,799 B2 | 10/2001 | Duane et al. | |
| 6,353,251 B1 | 3/2002 | Kimura | |
| 6,396,731 B1 | 5/2002 | Chou | |
| 6,404,018 B1 | 6/2002 | Wu et al. | |
| 6,424,174 B1 | 7/2002 | Nowak et al. | |
| 6,448,161 B1 * | 9/2002 | Krivokapic | 438/547 |
| 6,492,662 B2 * | 12/2002 | Hsu et al. | 257/124 |
| 6,518,589 B2 * | 2/2003 | King | 257/6 |
| 2001/0005327 A1 | 6/2001 | Duane et al. | |
| 2001/0013621 A1 | 8/2001 | Nakazato | |
| 2001/0019137 A1 | 9/2001 | Koga et al. | |
| 2001/0024841 A1 | 9/2001 | Noble, Jr. et al. | |
| 2001/0053568 A1 | 12/2001 | Deboy et al. | |
| 2002/0017681 A1 | 2/2002 | Inoue et al. | |
| 2002/0048190 A1 | 4/2002 | King | |
| 2002/0054502 A1 | 5/2002 | King | |
| 2002/0057123 A1 | 5/2002 | King | |
| 2002/0063277 A1 | 5/2002 | Ramsbey et al. | |
| 2002/0066933 A1 | 6/2002 | King | |
| 2002/0067651 A1 | 6/2002 | King | |
| 2002/0076850 A1 | 6/2002 | Sadd et al. | |
| 2002/0093030 A1 | 7/2002 | Hsu et al. | |
| 2002/0096723 A1 | 7/2002 | Awaka | |
| 2002/0100918 A1 | 8/2002 | Hsu et al. | |
| 2002/0109150 A1 | 8/2002 | Kajiyama | |

OTHER PUBLICATIONS

Neel, O. L, et al., "Electrical Transient Study of Negative Resistance in SOI MOS Transistors," Electronics Letters, vol. 26, No 1, pp. 73–74, Jan. 1990.

Mohan, S. et al., "Ultrafast Pipelined Adders Using Resonant Tunneling Transistors," IEE Electronics Letters, vol. 27, No. 10, May 1991, pp. 830–831.

Zhang, J.F. et al., "Electron trap generation in thermally grown SiO2 under Fowler–Nordhelm stress," J. Appl. Phys. 71 (2), Jan. 15, 1992, pp. 725–734.

Zhang, J.F. et al., "A quantitative investigation of electron detrapping in SiO2 under Fowler–Nordhelm stress," J. Appl. Phys. 71 (12), Jun. 15, 1992, pp. 5989–5996.

Zhang, J.F. et al., "A comparative study of the electron trapping and thermal detrapping in SiO2 prepared by plasma and thermal oxidation," J. Appl. Phys. 72 (4), Aug. 15, 1992, pp. 1429–1435.

Luryi, S. et al., "Collector–Controlled States in Charge Injection Transistors," SPIE–92 Symposium, pp. 1–12, 1992.

Luryi, S. et al., "Collector–Controlled States and the Formation of Hot Electron Domains In Real–Space Transfer Transistors," AT&T Bell Laboratories, pp. 1–7, 1992.

Luryi, S. et al., "Light–emitting Logic Devices based on Real Space Transfer in Complementary InGaAs/InAlAs Heterostructures", In "Negative Differential Resistance and trustabilities in 2D Semiconductors", ed. by N. Balkran, B. K. Ridley, and A. J. Vickers, NATO ASI Series [Physics] B 307, pp. 53–62, Plenum Press (New York 1993).

Mohan, S, et al., "Logic Design Based on Negative Differential Resistance Characteristics of Quantum Electronic Devices," IEE Proceedings–G: Electronic Devices, vol. 140, No. 6, Dec. 1993, pp. 383–391.

Mohan, S. et al., "Ultrafast Pipelined Arithmetic Using Quantum Electronic Devices," IEE Proceedings–E: Computers and Digital Techniques, vol. 141, No. 2, Mar. 1994, pp. 104–110.

Chan, E. et al., "Compact Multiple–Valued Multiplexers Using Negative Differential Resistance Devices," IEEE Journal of Solid–State Circuits, vol. 31, No. 8, Aug. 1996, pp. 1151–1156.

Chan, E. et al., "Mask Programmable Multi–Valued Logic Gate Using Resonant Tunnelling Diodes," IEE Proceedings–Circuits Devices Syst., vol. 143, No. 5, Oct. 1996, pp. 289–294.

Shao, Z. et al., "Transmission Zero Engineering in Lateral Double–Barrier Resonant Tunneling Devices," Dept. Of Electrical Engineering, University of Notre Dame, pp. 1–7 (1996).

Goldhaber–Gordon, David et al., "Overview of nanoelectronic devices," Proc. IEEE, 85(4), Apr. 1997, pp. 521–540.

Koester, S. J. et al., "Negative Differential Conductance in Lateral Double–Barrier Transistors Fabricated in Strained Si Quantum Wells," Applied Physics Letters, vol. 70, No. 18, May, 1997, pp. 2422–2424.

Dozsa, L. et al., "A transient method for measuring current –voltage characteristics with negative differential resistance regions," Research Institute for Technical Physics, P. O. Box 76, H–1325 Budapest, Hungary, (Received Jul. 24, 1997; accepted Aug. 1, 1997), 2 pages.

Pacha, C. et al., "Design of Arithmetic Circuits using Resonant Tunneling Diodes and Threshold Logic," Lehrstuhl Bauelemente der Elektrotechnik, Universitat Dortmund, pp. 1–11, Sep. 1997.

Hansch, W. et al., "The planar–doped–barrier–FET: MOSFET overcomes conventional limitations," ESSDERC'97 27th European Solid–State Device Research Conference, Stuttgart, Sep. 22–24, 1997, 4 pages.

Wirth, G. et al., "Periodic transconductance oscillations in sub–100nm MOSFETs," ESSDERC'97 27th European Solid–State Device Research Conference, Stuttgart, Sep. 22–24, 1997, 4 pages.

Haddad, G. I. et al., "Tunneling Devices and Applications in High Functionality/Speed Digital Circuits," Solid State Electronics, vol. 41, No. 10, Oct. 1997, pp. 1515–1524.

Gardner, C. et al., "Smooth Quantum Hydrodynamic Model Simulation of the Resonant Tunneling Diode," Dept. Of Mathematics Arizona State University, pp. 1–5, (1998).

Jungel, A. et al., "Numerical Simulation of Semiconductor Devices: Energy–Transport and Quantum Hydrodynamic Modeling," Fachbereich Math., Tech. Univ. Berlin, Germany, pp. 1–9, 1998.

Nimour, S. M. A. et al., "Effect of Spatially Disordered Barriers on the Band Structure of Finite Superlattices," phys. stat. sol. (b) 1998, 209, No. 2, 311–318.

Rommel, S. L. et al., "Room Temperature Operation of Epitaxially Grown Si/S10.5 Ge0.5/Si Resonant Interband Tunneling Diodes," Applied Physics Letters, vol. 73, No. 15, pp. 2191–2193, 1998.

Van der Wagt, J. P. A. et al., "RTD/HFET Low Standby Power SRAM Gain Cell," Source: Corporate Research Laboratories, Texas Instruments, 1998, 4 pages.

Sun, J. P. et al., "Resonant Tunneling Diodes: Models and Properties," Proceedings of the IEEE, vol. 86, No. 4, Apr. 1998, pp. 641–661.

Mazumder, P. et al., "Digital Circuit Applications of Resonant Tunneling Devices," Proceedings of the IEEE, vol. 86, No. 4, pp. 664–686, Apr., 1998.

News Release from www.eurekalert.org/releases/udei–udcnfib.html, "UD Computer News: Future Looks Bright for Tunnel Diodes, Promising Faster, More Efficient Circuits," Oct. 1, 1998, 4 pages.

Seabaugh A. et al., "Resonant Tunneling Mixed Signal Circuit Technology," Solid–State Electronics 43:1355–1365, 1999.

Wirth, G. et al., "Negative Differential Resistance in Ultrashort Bulk MOSFETs," IECON'99 Conference Proceedings, vol. 1, San Jose, 1999, pp. 29–34.

Mathews, R. H. et al., "A New RTD–FET Logic Family," Proceedings of the IEEE, vol. 87, No. 4, pp. 596–605, 1999.

Van der Wagt, J. P. A., "Tunneling–Based SRAM," Proceedings of the IEEE, vol. 87, No. 4, pp. 571–595, 1999.

Heij, C. P. et al., "Negative Differential Resistance Due to Single–Electron Switching," Applied Physics Letters, vol. 74, No. 7, Feb. 15, 1999, 5 pages.

Pacha, C. et al., "Resonant Tunneling Device Logic Circuits," Microelectronics Advanced Research Initiative (MEL–ARI,) Jul. 1998–Jul. 1999, pp. 1–22.

Hong, J.W. et al., "Local charge trapping and detection of trapped charge by scanning capacitance microscope in SiO2/Si system," Appl. Phys. Lett., 75 (12), Sep. 20, 1999, pp. 1760–1762.

Haddab, Y. et al., "Quantized current jumps in silicon photoconductors at room temperature," J. Appl. Phys. 85 (7), Oct. 1, 1999, pp. 3787–3791.

Seabaugh, A., "Promise of Tunnel Diode Integrated Circuits," Tunnel Diode and CMOS/HBT Integration Workshop, Dec. 9, 1999, Naval Research Laboratory, Washington, DC., 13 Pages.

Zhang, J., "Traps: Detrapping," Wiley Encyclopedia of Electrical and Electronics Engineering Online, Article Posting Date: Dec. 27, 1999, John Wiley & Sons, Inc., 4 Pages.

Zhang, J., "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Zhang, J., "Traps: Measurement Techniques," Wiley Encyclopedia of Electrical and Electronics Engineering Online, Article Posting Date: Dec. 27, 1999, John Wiley & Sons, Inc., 5 Pages.

Zhang, J., "Traps," Wiley Encyclopedia of Electrical and Electronics Engineering Online, Article Posting Date: Dec. 27, 1999, John Wiley & Sons, Inc., 2 Pages.

Zhang, J., "Traps: Trapping Kinetics," Wiley Encyclopedia of Electrical and Electronics Engineering Online, Article Posting Date: Dec. 27, 1999, John Wiley & Sons, Inc., 2 Pages.

Zhang, J., "Traps: Origin of Traps," Wiley Encyclopedia of Electrical and Electronics Engineering Online, Article Posting Date: Dec. 27, 1999, John Wiley & Sons, Inc., 4 pages.

Gonzalez, A. et al., "Standard CMOS Implementation of a Multiple–Valued Logic Signed–Digit Adder Based on Negative Differential–Resistance Devices," Proceedings of the 30th IEEE International Symposium on Multiple–Valued Logic (ISMVL 2000), 6 pages.

Karna, Shashi P. et al., "Point defects in Si–SiO2 systems: current understanding," Published in G. Pacchioni et al. (eds.), "Defects in SiO2 and related dielectrics: science and technology," Kluwer Academic Publishers, (2000), 19 pages.

King, Tsu–Jae et al., Ser. No. 09/602,658, entitled "CMOS Compatible Process for Making a Tunable Negative Differential Resistance (NDR) Device," filed Jun. 22, 2000, 33 pages.

King, Tsu–Jae et al., Ser. No. 09/603,101, entitled "CMOS–Process Compatible, Tunable NDR (Negative Differential Resistance) Device and Method of Operating Same," filed Jun. 22, 2000, 34 pages.

King, Tsu–Jae et al., Ser. No. 09/603,102, entitled "Charge Trapping Device and Method for Implementing a Transistor having a Negative Differential Resistance Mode," filed Jun. 22, 2000, 39 pages.

Geppert, Linda, "Quantum transistors: toward nanoelectronics," IEEE Spectrum, Sep. 2000, pp. 46–51.

Seabaugh, A. et al., "Tunnel–Diode IC," Minneapolis, Oct. 2, 2001, 23 pages.

Believed to be published in: Deen, Jamal (editor) et al., excerpt from "CMOS RF modeling, characterization and applications," World Scientific, Apr. 2002, 34 pages.

Scoffield, John H. et al., "Reconcillation of different gate-voltage dependencies of 1/f noise in n–MOS and p–MOS transistors," IEEE Trans. Electron. Dev. 41 (11), 11 pages.

Final Report: SMILE MEL–ARI Project n'28741—Chapter V, pp. 184–194.

Villa, S. et al. "Application of 1/f noise measurements to the characterization of near–interface oxide states in ULSI n–MOSFET's," Dipartimento di Elettronica e Informazione, Politecnico i Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyristor–based SRAM Cell (T–RAM) for High–Speed, Low–Voltage, Giga–scale Memories," Center for integrated Systems, Stanford University, CA, (4 pages).

Shoucair F. et al., "Analysis and Simulation of Simple Transistor Structures Exhibiting Negative Differential Resistance," EECS Department, UC Berkeley, Berkeley CA, (4 pages).

Oberhuber, R. et al., "Tunnel–Devices with Negative Differential Resistivity Based on Silicon?," Source: Deutsche Forschungs gemeinschaft and Siemens AG, date unknown, 2 pages.

* cited by examiner

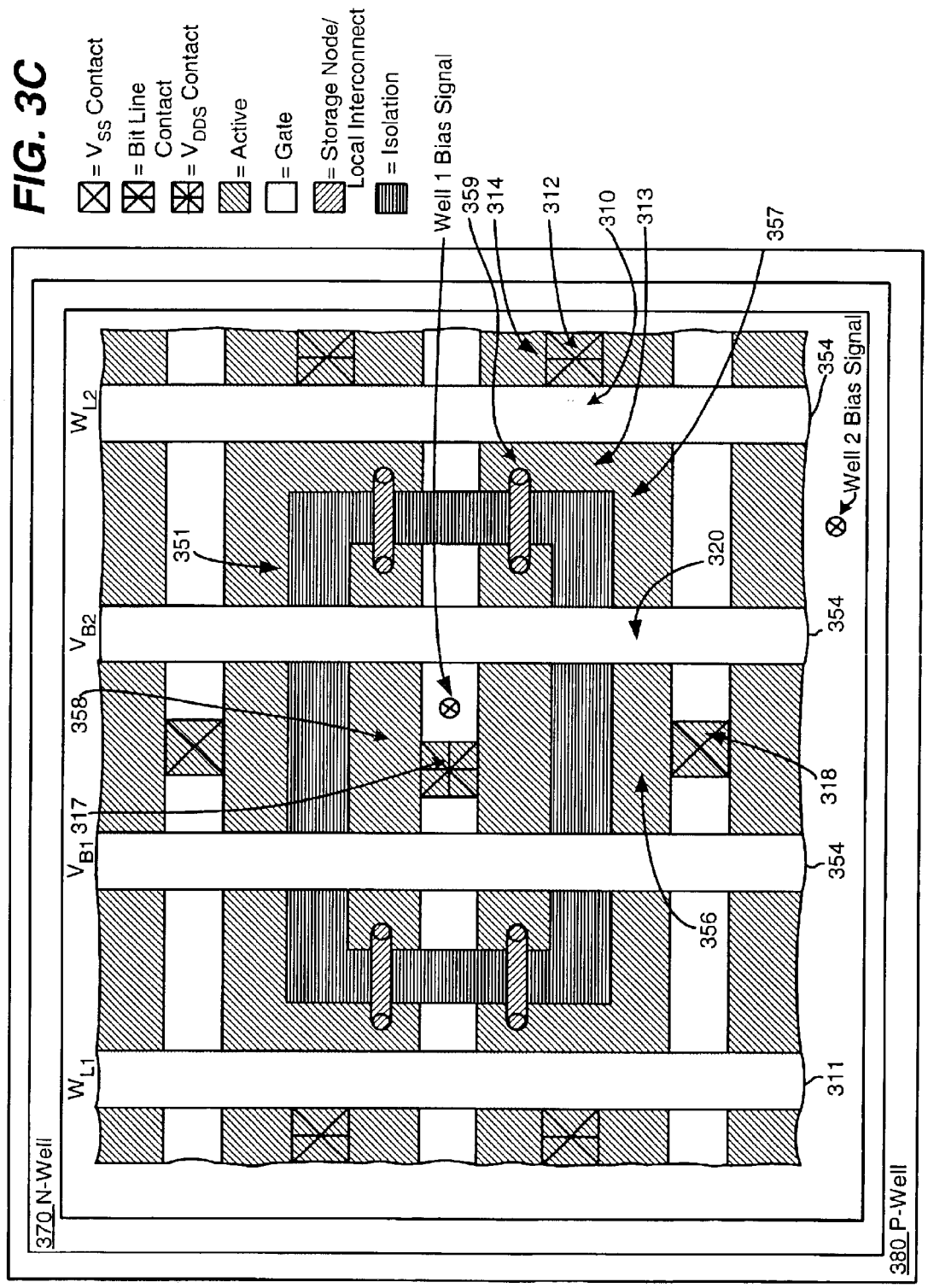

NEGATIVE DIFFERENTIAL RESISTANCE (NDR) BASED MEMORY DEVICE WITH REDUCED BODY EFFECTS

FIELD OF THE INVENTION

This invention generally relates to semiconductor memory devices and technology, and in particular to static random access memory (SRAM) devices that utilize negative differential resistance (NDR) elements.

BACKGROUND OF THE INVENTION

A new type of SRAM device using Negative Differential Resistance Field Effect Transistors (NDR FETs) is described in detail in a patent application Ser. No. 10/029,077 filed Dec. 21, 2001 by T J King and assigned to the present assignee, and published on May 9, 2002 as Publication No. 2002/0054502. The NDR FET structure, operation and method of making the same are discussed in detail in patent application Ser. No. 09/603,101 filed Jun. 22, 2000 by King et al., which is also assigned to the present assignee. Such details are also disclosed in a corresponding PCT application PCT/US01/19825 which was published as publication no. WO 01/99153 on Dec. 27, 2001. The above materials are hereby incorporated by reference.

As is well-known in the art, the "body effect" refers to a phenomenon in which a threshold voltage of a transistor is increased substantially when a body-to-source pn junction is reverse-biased. This effect can also influence SRAM embodiments which use NDR devices. For instance in the SRAM embodiment of FIG. 1, the body effect causes Vt of "pull-up" NDR FET 130 to be increased when data stored at node Vsn is a high value (Vdd); in such instances, a relatively high gate bias (Vdd+Vt) is required then to switch "pull-up" NDR FET 130.

Thus there is clearly a need for NDR based SRAM device that have superior body effect characteristics.

SUMMARY OF THE INVENTION

An object of the present invention is to provide a memory device, such as a static random access memory (SRAM) cell, which utilizes NDR FET elements and has improved body effect performance.

Thus, a first aspect of the invention provides for a memory device that includes a data transfer element (preferably a FET) adapted to facilitate (preferably through a WORD and BIT line) a read operation or a write operation involving a storage node of the memory cell (i.e., to charge or discharge such node to a high or low potential representing either a logical 1 or 0). A first negative differential resistance (NDR) element (preferably an NDR capable FET) is coupled to the data transfer element, the storage node and a first voltage potential. Thus, the first NDR element exhibits an NDR characteristic in a current path between the storage node and the first voltage potential. A second NDR element is coupled to the first NDR element (preferably in series in a pull-up/pull-down configuration), the data transfer element, the storage node and a second voltage potential. The second NDR element also exhibits an NDR characteristic in a current path located between the storage node and the second voltage potential. In this first aspect of the invention the data transfer element, the first NDR element and the second NDR element are located within a single common well situated in a silicon based substrate. The single common well is doped with a first type of dopant (preferably P-type) that is opposite to a second type of dopant used in the silicon based substrate (preferably N-type). In this fashion, the single common well can be biased so as to float a body region of the elements in the memory device, including the data transfer element, the first NDR element and the second NDR element. This, in turn, reduces a body effect for such devices, and results in improved performance.

The memory device in a preferred embodiment is a static random access memory (SRAM) cell used in an embedded environment, but other applications will benefit as well from the present teachings. Furthermore, as formed, the storage node includes a common region shared by the transfer FET, the first NDR element and the second NDR element to reduce layout space and increase the compactness of the cell.

In a second aspect of the invention, the memory device has a structure wherein a transfer FET is located within a first well (preferably p-type) situated in a silicon based substrate (preferably n-type). The first NDR element and the second NDR element are located within a second well situated separately from the first well in the silicon based substrate, which second well is also doped with the first type of dopant. In this configuration, at least the second well is biased so as to float a body region of the first NDR element and the second NDR element to reduce body effects. This configuration is slightly less compact than the version above, since two separate wells (and associated isolation regions) are required. Thus, in such approach, the storage node is shared by the first NDR element and the second NDR element, and is connected by a conductive interconnect (i.e., metal or doped polysilicon) to a separate source/drain region for the transfer FET.

In a third aspect of the invention the transfer FET and the first NDR element (preferably the pull-down element) are located within a first well while the second NDR element is located within a second well situated separately from the first well in the silicon based substrate. Both wells are p-type, but only the second well is biased so as to float a body region of the second NDR element to reduce body effects. As above, this implementation is less compact than a single well architecture, but may have superior performance for some applications.

In a fourth aspect of the invention, a silicon-on-insulator (SOI) embodiment of a memory device using NDR elements employs a body region that is either floated (to reduce cell size) or biased (to reduce floating body effects).

BRIEF DESCRIPTION OF THE DRAWINGS

FIG. 3C is a top level view of a topology and layout for an SRAM cell of a third embodiment of an SRAM cell with reduced body effect, in which one NDR-FET element is connected and formed in a first p-type well with an IGFET transfer element, while a second NDR FET element is formed within a separate second p-type well using a triple well process;

DETAILED DESCRIPTION OF THE INVENTION

Various embodiments of the invention are now described.

As noted earlier, FIG. 1 is a circuit diagram of a preferred embodiment of a static memory (SRAM) cell 100 consisting of two NDR elements 120, 130 which form a bistable latch 140 and one enhancement-mode IGFET access element 110.

Figure 1:
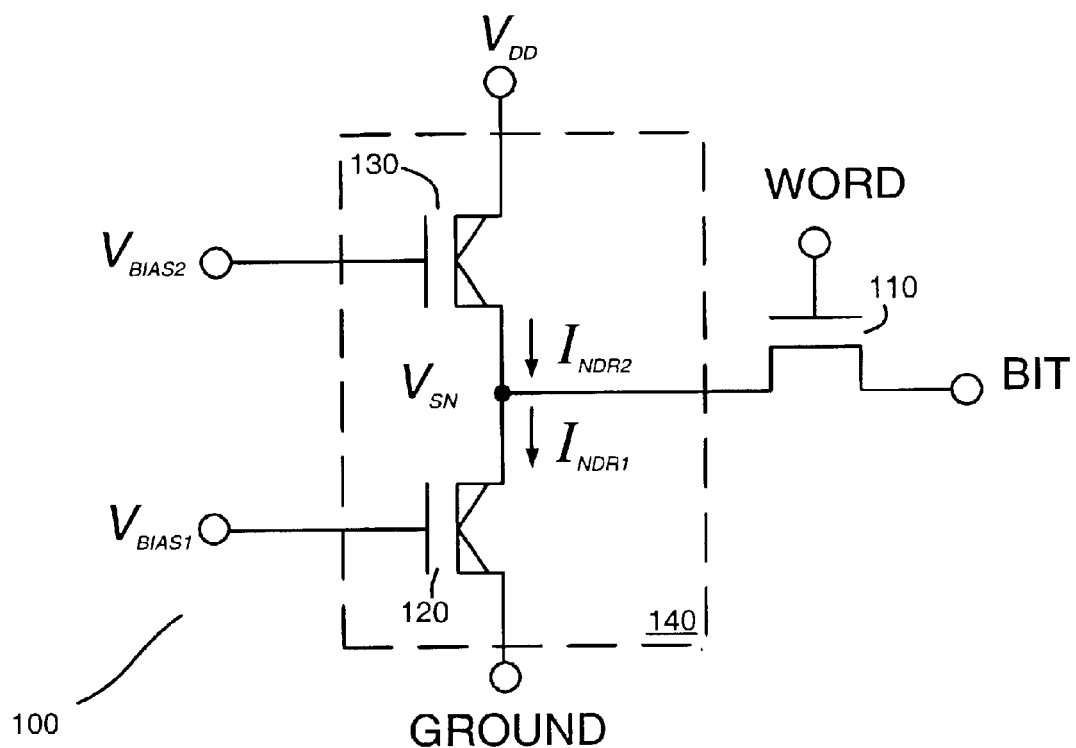
FIG. 1 is a circuit diagram of a static random access memory (SRAM) cell consisting of the combination of two NDR-FET elements which form a bistable latch and one n-channel enhancement-mode IGFET access element.
Figure 2:
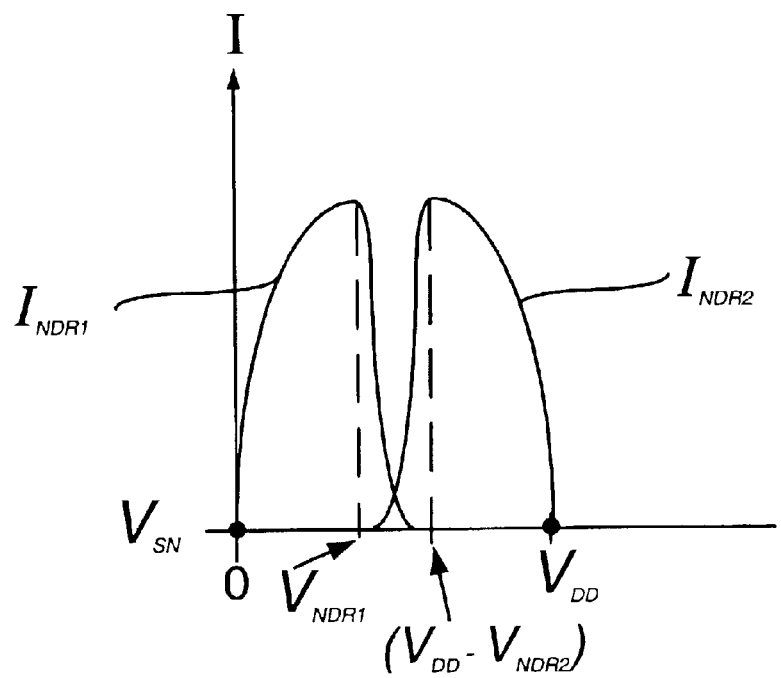
FIG. 2 is a plot of the current-vs.-voltage characteristic of the bistable latch formed by the combination of two NDR-FETs as shown in FIG. 1.

FIG. 2 is a current-vs.-voltage plot illustrating the operational characteristics of the static memory cell 100 of FIG. 1.

NDR elements 120, 130 of the present invention are preferably an NDR FET of the type referred to above in the aforementioned King et al. applications. The details of the same are provided for example in the aforementioned applications, and such documents are incorporated by reference herein primarily for the purpose of providing non-essential background information on representative types of environments in which the present inventions can be practiced. Other types of silicon based NDR FETs are clearly suitable and encompassed within the present teachings.

As noted earlier, the "body effect" is a well-known problem in memory (and other) applications in which the threshold voltage of a transistor (such as a pull up FET) is increased as a result of a logical high state being stored at a storage node $V_{SN}$. In such instance, a body to source p-n junction is reverse-biased. For instance in the SRAM embodiment of FIG. 1, the body effect causes Vt of "pull-up" NDR FET 130 to be increased when data stored at node Vsn is higher than Vss; this increases the value of the gate bias (Vdd+Vt) required for the "pull-up" NDR FET 130 to maintain a high voltage (Vdd) at node Vsn.

The inventor has determined nonetheless that the body effect can be virtually eliminated in such embodiments by electrically floating the body of any NDR elements used within an SRAM, including NDR FETs 120 and 130 of an SRAM cell 100 shown in FIG. 1.

First Embodiment

Figure 3A:
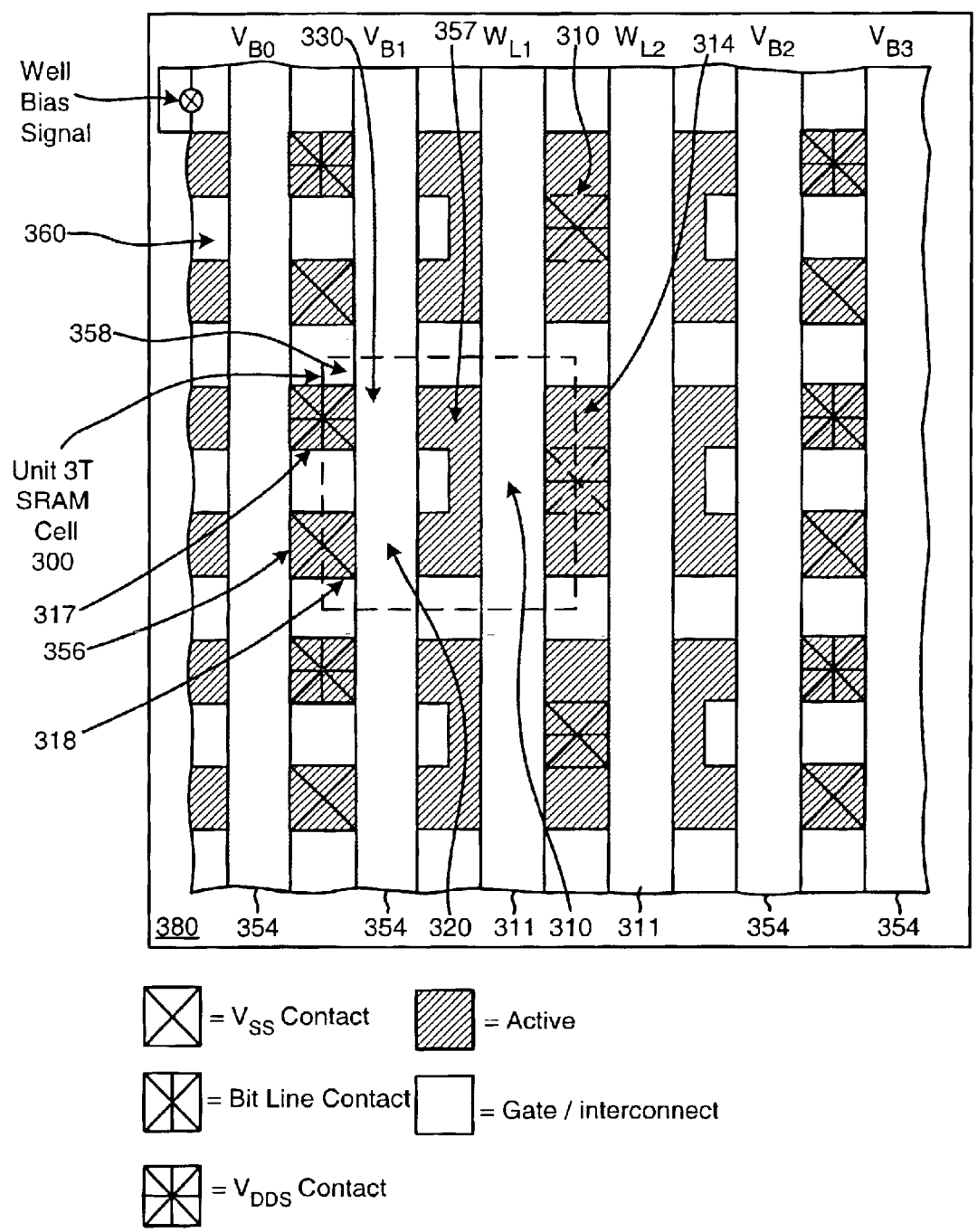
FIG. 3A is a top level view of a topology and layout for an SRAM cell of a first embodiment of an SRAM cell with reduced body effect, in which NDR-FET elements are connected and formed in common with an IGFET within a single p-type well.

In a first embodiment of the invention shown in FIG. 3A a layout is optimized and made most compact by placing all of the elements (transistors in this case) in a single cell (FIG. 1) within a single well. As regards the layout of the cell and array shown in FIG. 3A, like numeric designations are intended to denote like structures and features already depicted in FIG. 1. It will be understood by those skilled in the art that the structure shown in FIG. 3A (and the other figures) is only intended to depict a small section of a representative memory array employing the present invention, and is not drawn to scale. The size, relationship and materials used for the structures shown in these figures may be altered significantly from that shown without departing from the present teachings.

Thus, in the case of an SRAM cell comprised entirely of N channel FETs (including NDR elements 320, 330 and the transfer gate 310 and other structures), a single P type well (p-well) 360 is formed within an N type substrate 380 using conventional techniques as seen in FIG. 3A. This p-well can be provided with a separate bias signal (WELL BIAS) at a well contact so that it can be biased or floated as is appropriate. Again it will be understood by those skilled in the art that a separate well bias contact/terminal may or may not be provided, and the figure is merely intended to facilitate understanding of the invention.

The remainder of the layout of a memory array as shown in FIG. 3A illustrates the following: a cell 300(1) highlighted in a hashed box includes an NDR pull-down element 320 with a source region 356 connected through a contact 318 to a ground or low reference potential Vss (the Vss line is not shown to avoid obscuring the invention) and an active region 357 forming a drain of NDR pull-down element 320 as well as a part of a storage node VSN. A bias line 354 provides a bias signal VB1 to NDR pull-down element 320, as well as to NDR pull-up element 330.

Active region 357 is also shared and acts as a source/drain region for NDR pull-up element 330 and a source/drain region for pass transistor 310. Thus, a single doped region in well 360 is preferably used by three separate FETs (including a mixture of regular FETs and NDR based FETs) to increase the integration density of cell 300.

NDR pull-up element 330 also has a source/drain region 358 connected to a positive or high reference potential Vdd at contact 317 (the Vdd line is also not shown to avoid obscuring the invention).

A word line WL1 311 provides an activation signal for Read/Write operations in conventional fashion, and further acts as a gate for pass transistor 310. A final source/drain region 314 for pass transistor 310 is connected to a Bit Line (again not shown to avoid obscuring the invention) through contact 316 for communicating data in and out of cell 300.

Other pertinent observations concerning an embodiment of the invention such as illustrated in FIG. 3A include: (1) cell size is reduced by sharing Vdd contact regions, Vss contact regions, and Bit Line contact regions between adjacent memory cells; (2) cell size is also reduced by forming both NDR and non-NDR elements with common regions within cell 300, such as active region 357; (3) processing complexity is reduced, because manufacturing operations for NDR and non-NDR elements are both effectuated using common CMOS techniques for isolation regions, active regions, gate insulations, gate interconnects, etc.

The most compact 3-T SRAM layout shown in FIG. 3A has a cell size of 16 $F^2$, where F is the minimum feature size. This layout assumes that self-aligned, borderless contact process technology is available, and that the spacing between the NDR FETs and the regular FET can be minimal. For a 130 nm technology, the layout area is thus about 0.27 $um^2$, which is about 11% as big as (or 9× smaller than) a conventional 6-T SRAM. It should be noted that this is simply the smallest size available at this time given current processing techniques, and that other process improvements unforeseeable at this time to the inventor may yield additional cell size reductions.

Furthermore, the above presents one best case layout obtainable at this time, and it will be understood by those skilled in the art that current conventional 130 nm process geometry technologies may require different spacings, sizings, etc., so as to yield a cell as large as 40 $F^2$. Nonetheless, since a conventional 6-T SRAM has an approximate surface area of about 2.43 $um^2$ the reduction is still extremely significant. In fact, the present cell in a worst case would be about 28% of the area required for a conventional cell, achieving better than a 3.5 times reduction in total area. Again, it will be understood of course that this figure will vary significantly from geometry-to-geometry and from fab-to-fab in accordance with specific design rules that are used for a particular process.

Second and Third Embodiments

Figure 3B:
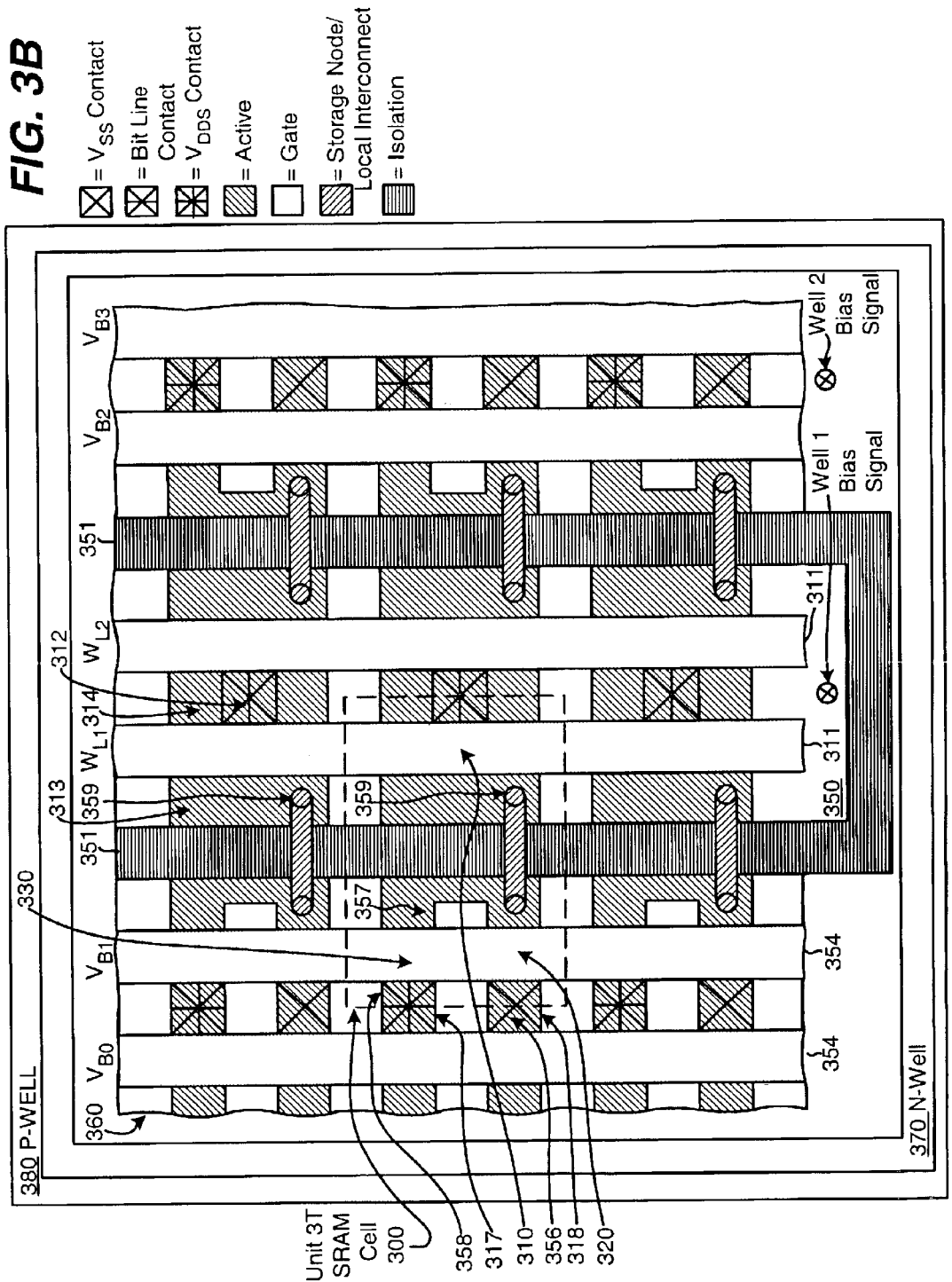
FIG. 3B is a top level view of a topology and layout for an SRAM cell of a second embodiment of an SRAM cell with reduced body effect, in which NDR-FET elements are connected and formed in a first p-type well, while an IGFET transfer element is formed within a separate second p-type well using triple-well process.

In other embodiments however, such as shown in FIGS. 3B and 3C, it may be desirable to only float the body of "pull-up" NDR FET 330, or the body of both the NDR FETs 320 and 330. Unless otherwise indicated, like numerals in FIGS. 3B and 3C are intended to refer to like structures from FIGS. 1 and 3A. Again, those skilled in the art will understand that the structure shown in FIGS. 3B and 3C is only intended to depict a small section of a representative memory array employing the present invention.

Thus, in a second embodiment of the invention, as seen in FIG. 3B, a well-known "triple-well" fabrication process is employed to provide separate body contacts and biasings for the NDR and non-NDR devices in an SRAM cell 300. That is, pass transistor 310 is situated in a p-well 350, while NDR FETs 320 and 330 are situated in a separate p-well 360. The two wells are isolated by an isolation region 351. P wells 350 and 360 are also commonly formed in an N-well 370, and the latter is also itself situated within a further P well 380. As formed, pass transistor 310 is connected to a word line 311 that forms also a gate electrode. A first source/drain region 314 is connected to a bit line 312, while a second source/drain region 313 is connected and forms part of the storage node having a voltage Vsn. Thus, as formed, pass transistor 310 is located entirely within P well 350. Other pass transistors in the array (not shown) can also be formed within P well 350 and use a single common well bias contact for a well bias signal WELL1 BIAS.

Similarly, first NDR FET 320 includes an input bias line connected to a Vbias1 input VB1, and also forming part of a gate electrode. A first reference low voltage supply source Vss is provided to a contact formed in a first source/drain region 356. A second source/drain region 357 is shared with second NDR FET 330, and is also coupled through an interconnect 359 to pass transistor 310. This shared region also acts as part of the storage node $V_{SN}$ for SRAM cell 300.

Second NDR FET 330 includes an input bias line 354 connected to a Vbias2 input, and which also forms part of a gate electrode. In a preferred embodiment, Vbias1 and Vbias2 are connected to the same signal supply through a common interconnect 354. A second reference high voltage supply source Vdd is provided through a contact 317 which is coupled a third source/drain region 358.

As seen in FIG. 3B, both NDR FET 320 and NDR FET 330 (and other NDR FETs not shown) are formed in a p-well 360, which is separate from p-well 350 in which pass transistor 310 is formed. A bias signal WELL1 BIAS can be applied to a contact coupled to p-well 360 as shown, or in some other form.

Thus, separate body biasings can be provided to the different types of FETs (at respective contacts for WELL1 BIAS and WELL2 BIAS) in a single memory cell so that, for example, a body contact for NDR FETs 320, 330 can be left floating to reduce body effects.

To improve integration, NDR source/drain regions are shared within a cell, and adjacent cells also share common Vss and VDD contacts, and bit line contacts. Again it will be understood by those skilled in the art that separate well bias contacts may or may not be provided, and the figure is merely intended to facilitate understanding of the invention.

For a third embodiment of the invention, as seen in FIG. 3C, only one of the NDR FETs is formed in a separate p-well 360; namely, pull-up NDR FET 330. Such wells can be shared between adjacent cells and given separate bias contacts 390 as shown therein.

Other embodiments of the same will be apparent from the present teachings, and the present invention is by no means limited to the examples herein. Again it will be appreciated by those skilled in the art that the depicted layouts in FIGS. 3A, 3B and 3C are not intended to be to scale, and are not intended to describe every possible arrangement of the various structures and features therein. For example, the location and relative size of the interconnect layers (between source/drain regions) has been altered to make the features of the invention more apparent. Many other features shown may vary in size, relationship or structure from that illustrated. Other supporting structures may also be incorporated within an SRAM cell 100, including conventional NDR diodes.

Standard techniques for forming triple wells are well-known, and any suitable process can be employed with the present invention to achieve the result of allowing separate body biasing of the various elements in SRAM cells. It will be noted, of course, that the layout in triple well embodiments is not as compact (as can be seen by comparing FIGS. 3A, 3B and 3C) because of required well-to-well spacings within a cell, but it may be necessary in some applications.

Consequently, SRAM bulk Silicon embodiments of the present invention can include one or more of the following variations to improve body effect performance:
  i) body floating for all elements (including the three transistors as seen in FIG. 3A);
  ii) body floating for both NDR elements (as seen in FIG. 3B);
  iii) body floating for a "pull-up" (or load) NDR element only (as seen in FIG. 3C)

Fourth Embodiment—SOI

In addition to bulk Si type cells of the type described above, embodiments of the present invention can also be effectuated in Silicon-on-Insulator (SOI) based substrates. As is well-known, SOI devices differ from bulk Si devices primarily by the fact that in the former a buried oxide layer insulates a thin silicon layer body (for the active devices) from the bulk Si substrate. The active devices are patterned (typically) as mesas above the buried oxide layer. The process is somewhat less mature than regular bulk Si CMOS processes, but the result is a pattern of distinct and individual active devices isolated from each other by the insulator layer with superior leakage and parasitic performance over bulk Si for fine scaled geometries.

Two particular types of SOI technology that can be used with the present invention include: (1) partially depleted; (2) fully depleted implementations. These are not intended to be exhaustive, of course, and it will be understood by those skilled in the art that the present invention is not limited to these specific types of SOI technology.

These cases are explained with reference to FIG. 4, which illustrates a cross section of a typical SOI transistor 401 which, as explained herein, can also be configured as NDR capable FETs. Each transistor is formed on bulk silicon substrate 405, and a buried oxide (insulator) layer 410. Each transistor further includes a pair of N+ source/drain regions (415, 425) doped N type (for an n channel device) and a body region 420 doped with a net P type concentration (as explained above for the bulk Si case). The source/drain (415, 425) and body structures (425) are typically formed by a thin single-crystalline silicon film that is later patterned and etched to yield the resulting structures shown in FIG. 4. A gate insulating layer 430 includes a trapping region 437 (of the type described in the aforementioned King et al applications) for forming traps, and the net P type concentration in body 420 (also formed as explained in the aforementioned King et al applications) help provide a carrier trapping effect to create an NDR effect as noted in such applications.

A gate contact 440 completes the device, and in most instances this is made of an N+ doped polycrystalline silicon material. An interconnect layer (not shown) contacts the NDR FET to provide an NDR bias signal of the type described earlier. It will be apparent that the as-shown SOI FET 401 can thus be adapted as an SOI NDR FET and incorporated for use in a memory cell 100 of the type shown in FIG. 1.

Figure 4:
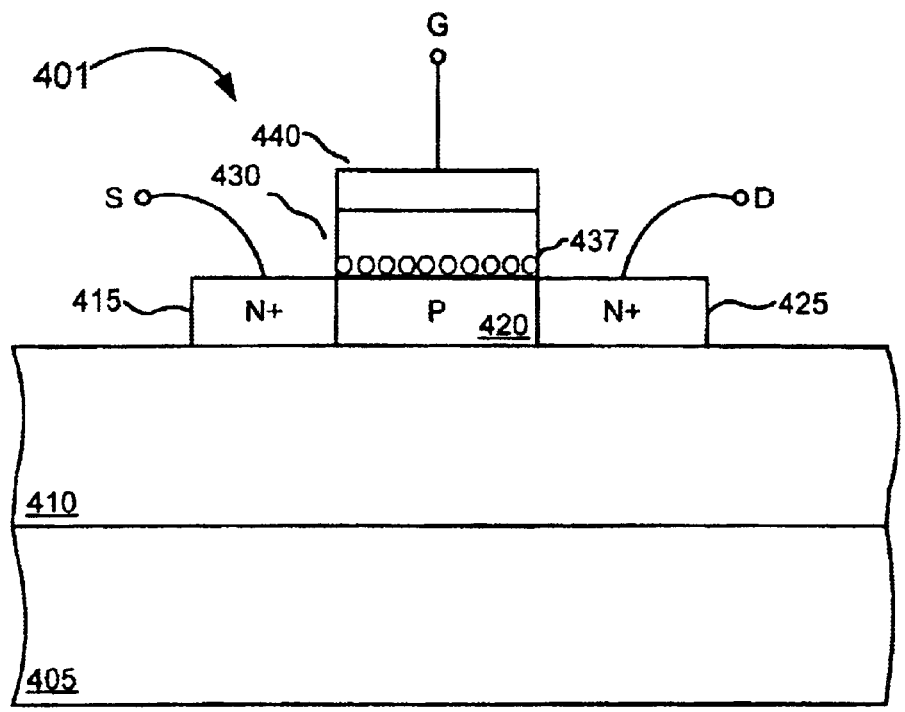
FIGS. 4 and 4A are cross sectional and top views respectively of an exemplary SOI based NDR FET that can be used in an SRAM cell.
Figure 4A:
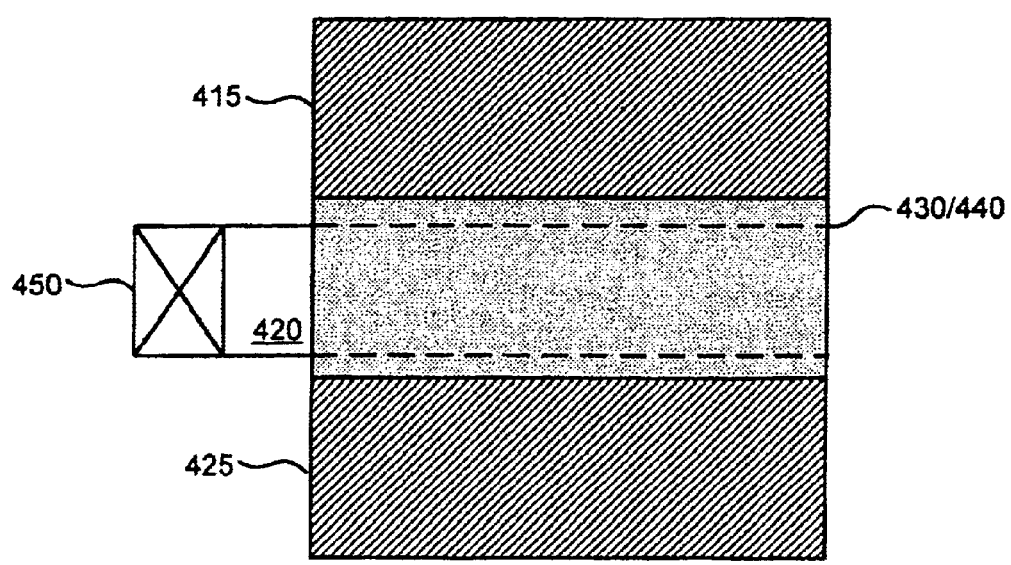

As seen in FIG. 4A, to implement the present invention in SOI therefore, a separate body contact (and interconnect) 450 are provided for each transistor 401, if body biasing is desired to operate in a non-floating body effect mode, because each transistor is fabricated in a separate "island" of SOI. It can be seen quite clearly (from for this single transistor case) that the layout area penalty for an array of such interconnected transistors configured for an SRAM is thus larger than for a bulk-Si technology in which many transistors can reside in a single well and body contact is provided to each of those transistors with a single well contact.

As an alternative, and in a preferred embodiment it is possible also to simply allow the bodies of SOI NDR transistors to "float", that is, to not provide direct electrical contacts to the transistor body regions 420 to reduce the additional space consumed by such contact. This also cuts down significantly, of course, on the complexity of the process since separate interconnect layer(s) are not required for biasing the body regions.

In any event, with reference to FIG. 4, the partially depleted (1) case refers to the situation where an SOI layer 420 (forming the body regions of the NDR and non-NDR FETs) is partially depleted for a transistor in the ON state. In this case, the well-known "floating body effect" associated with SOI transistors will cause the drain current to increase at high drain voltages, resulting in a "kink" in the Ids vs. Vds characteristic for a fixed gate voltage (Vg>Vt).

This happens because impact ionization in the high-field region near the drain at high drain bias generates electron-hole pairs; the electrons flow out through the drain, while the holes flow in the body toward the source junction, accumulating there to forward bias the source pn junction and effectively lowering the transistor Vt. The "floating body effect" decreases the transistor Vt at high drain biases and thus will serve to increase the peak current of the NDR-FET; it will increase the valley current more so (since the valley current is exponentially dependent on Vt, while the peak current is linearly dependent on Vt), so the net effect will be a lower PVR.

In contrast, the fully depleted case (2) refers to a condition in which the body region can be fully depleted for a transistor in the ON state. In this case, the "floating body effect" is negligible, because the holes generated by impact ionization in the high-field region near the drain can flow through the body into the source relatively easily. Thus, the potential barrier to hole flow into the source is very small, for a fully depleted body. The detrimental effect on PVR is therefore avoided.

Consequently, in those embodiments where the "floating body effect" is a critical factor for a particular cell design and geometry, it is preferable to use a fully-depleted SOI technology for an SOI NDR based SRAM cell 100.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicant further reserves the right to pursue new and/or additional claims directed to any such novel and non-obvious features during the prosecution of the present application (and/or any related applications).

What is claimed is:

1. A memory device comprising:
    a data transfer element adapted to facilitate a read operation or a write operation involving a storage node of the memory cell; and
    a first negative differential resistance (NDR) element coupled to said data transfer element, said storage node and a first voltage potential, wherein said first NDR element is adapted to operate with a first NDR characteristic between said storage node and said first voltage potential; and
    a second NDR element coupled to said first NDR element, said data transfer element, said storage node and a second voltage potential wherein said second NDR element is adapted to operate with a second NDR characteristic between said storage node and said second voltage potential;
    said data transfer element, said first NDR element and said second NDR element are located within a single common well situated in a silicon based substrate, said single common well being doped with a first type of dopant that is opposite to a second type of dopant used in said silicon based substrate;
    wherein said single common well is biased so as to float a body region of said data transfer element, said first NDR element and said second NDR element.

2. The memory device of claim 1, wherein said memory device is a static random access memory (SRAM) cell.

3. The memory device of claim 1, wherein p-type dopant is used for said single common well.

4. The memory device of claim 1, wherein said storage node includes a common region shared by said transfer FET, said first NDR element and said second NDR element.

5. The memory device of claim 1, wherein said data transfer element is a field effect transistor (FET) and said first NDR element and said second NDR element are NDR-capable FETs.

6. The memory device of claim 5, wherein a body effect is substantially reduced for said NDR capable FETs.

7. A memory device comprising:
    a transfer field effect transistor (FET) adapted to facilitate a read operation or a write operation involving a storage node of the memory device; and wherein said transfer FET is located within a first well situated in a silicon based substrate, said first well being doped with a first type of dopant that is opposite to a second type of dopant used in said silicon based substrate;

a first negative differential resistance (NDR) element coupled to said transfer FET, said storage node and a first voltage potential, wherein said first NDR element is adapted to operate with a first NDR characteristic between said storage node and said first voltage potential; and a second NDR element coupled to said first NDR element, said transfer FET, said storage node and a second voltage potential wherein said second NDR element is adapted to operate with a second NDR characteristic between said storage node and said second voltage potential;

wherein said first NDR element and said second NDR element are located within a second well situated separately from said first well in said silicon based substrate, said second well also being doped with said first type of dopant;

further wherein at least said second well is biased so as to float a body region of said first NDR element and said second NDR element to reduce body effects.

8. The memory device of claim 7, wherein said memory device is a static random access memory (SRAM) cell.

9. The memory device of claim 7, wherein p-type dopant is used for said single common well.

10. The memory device of claim 7, wherein said storage node includes a common region shared by said first NDR element and said second NDR element, and which common region is connected by a conductive interconnect to a separate source/drain region for the transfer FET.

11. The memory device of claim 7, wherein said first NDR element and said second NDR element are NDR capable FETs.

12. The memory device of claim 11, wherein a body effect is substantially reduced for said NDR capable FETs.

13. A memory device comprising:
a transfer field effect transistor (FET) adapted to facilitate a read operation or a write operation involving a storage node of the memory cell; and a first negative differential resistance (NDR) element coupled to said transfer FET, said storage node and a first voltage potential, wherein said first NDR element is adapted to operate with a first NDR characteristic between said storage node and said first voltage potential; and wherein said transfer FET and said first NDR element are located within a first well situated in a silicon based substrate, said first well being doped with a first type of dopant that is opposite to a second type of dopant used in said silicon based substrate;

a second NDR element coupled to said first NDR element, said transfer FET, said storage node and a second voltage potential wherein said second NDR element is adapted to operate with a second NDR characteristic between said storage node and said second voltage potential;

wherein said second NDR element is located within a second well situated separately from said first well in said silicon based substrate, said second well also being doped with said first type of dopant;

further wherein at least said second well is biased so as to float a body region of said second NDR element to reduce body effects.

14. The memory device of claim 13, wherein said memory device is a static random access memory (SRAM) cell.

15. The memory device of claim 13, wherein p-type dopant is used for said single common well.

16. The memory device of claim 13, wherein said storage node includes a common region shared by said transfer FET and said first NDR element, and which common region is connected by a conductive interconnect to a separate source/drain region for said second NDR element.

17. The memory device of claim 13, wherein said first NDR element and said second NDR element are NDR capable FETs.

18. The memory device of claim 16, wherein a body effect is substantially reduced for said second NDR capable FET.

19. In a memory device having three active elements, including a transfer field effect transistor (FET), a first negative differential resistance (NDR) element and a second NDR element that are operably interconnected to store a data value, the improvement comprising:
at least one of the first NDR element and the second NDR element being implemented as an NDR-capable FET that is located in a first Common well;
wherein the first common well can be biased so as to float a body region of the NDR capable FET and reduce a body effect of at least such NDR capable FET.

20. In a memory device having at most three active elements, including a transfer field effect transistor (FET), a first negative differential resistance (NDR) element and an NDR pull-up element that are operably interconnected to store a data value, the improvement comprising:
the pull up NDR element and the pull down NDR element both being implemented as NDR-capable FETs that are located in a first common well with the transfer gate;
wherein the first common well can be biased so as to float a body region of the NDR pull-up FET and reduce a body effect of at least such NDR pull-up FET.

21. In a memory device having at most three active elements, including a transfer field effect transistor (FET), a negative differential resistance (NDR) pull-down element and an NDR pull-up element that are operably interconnected to store a data value, the improvement comprising:
the pull-up NDR element and the pull-down NDR element both being implemented as NDR-capable FETs that are located in a first common well that is different from a second well in which the transfer gate is located;
wherein the first well can be biased so as to float a body region of the NDR pull-up FET and reduce a body effect of at least such NDR pull-up FET.

22. In a memory device having at most three active elements, including a transfer field effect transistor (FET), a negative differential resistance (NDR) pull-down element and an NDR pull-up element that are operably interconnected to store a data value, the improvement comprising:
the pull-up NDR element being implemented as an NDR-capable FET that is located in a first well that is different from a second well in which the NDR pull-down element and the transfer gate are located;
wherein the first well can be biased so as to float a body region of the NDR pull-up FET and reduce a body effect of at least such NDR pull-up FET.

23. In a silicon on insulator (SOI) based memory device having three active elements, including a transfer field effect transistor (FET), a first negative differential resistance (NDR) element and a second NDR element that are operably interconnected to store a data value, the improvement comprising:

at least one of the first NDR element and the second NDR element being implemented as a SOI-based NDR-capable FET.

wherein a contact is provided to a body region of the SOI-based NDR capable FET so as to provide a bias signal and operate the SOI based memory device in a non-floating body effect mode.

24. In a silicon on insulator (SOI) based memory device having three active elements, including a transfer field effect transistor (FET), a first negative differential resistance (NDR) element and a second NDR element that are operably interconnected to store a data value, the improvement comprising:

at least one of the first NDR element and the second NDR element being implemented as a SOI-based NDR-capable FET;

wherein a body region of the SOI-based NDR capable FET is floated so as to reduce a body effect.

25. The SOI based memory device of claim 24, wherein during operation said body region can be fully depleted when said SOI-based NDR capable FET is turned on.

26. The SOI based memory device of claim 24, wherein during operation said body region can only be partially depleted when said SOI-based NDR capable FET is turned on.

27. The SOI based memory device of claim 24, further including a trapping layer located above said body region for effectuating said negative differential resistance.

28. The SOI based memory device of claim 24, wherein exactly three active elements are used for each memory cell, and the transfer field effect transistor (FET), the first negative differential resistance (NDR) element and the second NDR element are all implemented in SOI form.

* * * * *